(12) United States Patent
Kim et al.

(10) Patent No.: US 10,439,015 B2
(45) Date of Patent: Oct. 8, 2019

(54) DISPLAY APPARATUS

(71) Applicant: Samsung Display Co., Ltd., Yongin-si, Gyeonggi-do (KR)

(72) Inventors: Yangwan Kim, Yongin-si (KR); Wonkyu Kwak, Yongin-si (KR); Jaedu Noh, Yongin-si (KR); Jaeyong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/838,138

(22) Filed: Dec. 11, 2017

(65) Prior Publication Data

US 2018/0102401 A1   Apr. 12, 2018

Related U.S. Application Data

(63) Continuation of application No. 14/660,813, filed on Mar. 17, 2015, now Pat. No. 9,842,892.

(30) Foreign Application Priority Data

Aug. 5, 2014 (KR) .................... 10-2014-0100700

(51) Int. Cl.
  *H01L 27/32* (2006.01)
  *H01L 27/12* (2006.01)
  *G02F 1/1362* (2006.01)

(52) U.S. Cl.
  CPC ........ *H01L 27/3272* (2013.01); *H01L 27/124* (2013.01); *H01L 27/3262* (2013.01);
  (Continued)

(58) Field of Classification Search
  CPC .............. H01L 27/3272; H01L 27/124; H01L 27/3262; H01L 27/3265; H01L 27/3276;
  (Continued)

(56) References Cited

U.S. PATENT DOCUMENTS 7,046,282 B1   5/2006 Zhang et al.
7,053,410 B2   5/2006 Kurashina et al.
(Continued)

FOREIGN PATENT DOCUMENTS

CN   1459656 A   12/2003
CN   1503041 A   6/2004
(Continued)

OTHER PUBLICATIONS

EPO Search Report dated Dec. 11, 2015, for corresponding European Patent application 15176212.7, (9 pages).
(Continued)

*Primary Examiner* — William Coleman
(74) *Attorney, Agent, or Firm* — Lewis Roca Rothgerber Christie LLP

(57) ABSTRACT

A display apparatus includes: a thin-film transistor including a source electrode, a drain electrode, and a gate electrode; a data line in a layer different from the source electrode, the drain electrode, and the gate electrode, wherein the data line is configured to transmit a data signal; and a shield layer between the data line and a component of the thin-film transistor.

33 Claims, 12 Drawing Sheets

(52) U.S. Cl.
CPC ...... *H01L 27/3265* (2013.01); *H01L 27/3276* (2013.01); *G02F 1/136213* (2013.01); *G02F 2001/13629* (2013.01); *G02F 2001/136218* (2013.01)

(58) Field of Classification Search
CPC ..... H01L 27/3248; G02F 2001/136218; G02F 2001/13629; G02F 1/136213
See application file for complete search history.

(56) References Cited

U.S. PATENT DOCUMENTS

| | | |
|---|---|---|
| 8,471,973 B2 | 6/2013 | Lin et al. |
| 9,953,572 B2 | 4/2018 | Fujita |
| 10,032,953 B2 | 7/2018 | Jeon et al. |
| 2003/0202267 A1 | 10/2003 | Yamasaki et al. |
| 2004/0253088 A1 | 12/2004 | Kawachi et al. |
| 2005/0068310 A1 | 3/2005 | Ishii |
| 2007/0029644 A1 | 2/2007 | Nakagawa |
| 2007/0228389 A1 | 10/2007 | Hsu et al. |
| 2009/0009441 A1 | 1/2009 | Yamamoto et al. |
| 2010/0110050 A1 | 5/2010 | Park et al. |
| 2011/0102693 A1 | 5/2011 | Oomura |
| 2012/0074423 A1 | 3/2012 | Kanegae |
| 2012/0229438 A1* | 9/2012 | Fujita .................. G09G 3/3233 345/211 |
| 2013/0235020 A1 | 9/2013 | Kim et al. |
| 2014/0062990 A1 | 3/2014 | Zhang |
| 2014/0070184 A1 | 3/2014 | Shin |
| 2014/0098078 A1 | 4/2014 | Jeon et al. |
| 2014/0167009 A1* | 6/2014 | Lee .................. H01L 27/3272 257/40 |
| 2015/0177578 A1 | 6/2015 | Uramoto |
| 2015/0364500 A1 | 12/2015 | Cheng et al. |

FOREIGN PATENT DOCUMENTS

| | | |
|---|---|---|
| CN | 102682697 A | 9/2012 |
| CN | 103681751 A | 3/2014 |
| EP | 1 365 277 A2 | 11/2003 |
| EP | 2 693 481 A2 | 2/2014 |
| KR | 10-2005-0021887 | 3/2005 |
| KR | 10-2010-0049901 | 5/2010 |
| KR | 10-2012-0048531 | 5/2012 |
| KR | 10-2012-0103463 | 9/2012 |
| KR | 10-2014-0035156 | 3/2014 |

OTHER PUBLICATIONS

KIPO Office action dated Oct. 1, 2015, for Korean priority Patent application 10-2014-0100700, (4 pages).
KIPO Notice of Allowance dated Apr. 11, 2016, for Korean priority Patent application 10-2014-0100700, (6 pages).

* cited by examiner

DISPLAY APPARATUS

CROSS-REFERENCE TO RELATED APPLICATION

This application is a continuation of U.S. patent application Ser. No. 14/660,813, filed Mar. 17, 2015, which claims priority to and the benefit of Korean Patent Application No. 10-2014-0100700, filed Aug. 5, 2014, the entire content of both of which is incorporated herein by reference.

BACKGROUND

1. Field

Embodiments of the present invention relate to a display apparatus.

2. Description of the Related Art

In an organic light-emitting display apparatus, thin-film transistors (TFTs) may be located in each (sub) pixel to control the luminance of each (sub) pixel. Such TFTs control the luminance of the sub (pixel) according to a received data signal.

However, luminance realized in a (sub) pixel of a general display apparatus may be different from that depending on a received data signal. Accordingly, an image displayed on the general display apparatus may have deteriorated quality.

SUMMARY

One or more embodiments of the present invention include a display apparatus for preventing quality deterioration of a displayed image.

Additional aspects will be set forth in part in the description which follows and, in part, will be apparent from the description, or may be learned by practice of the presented embodiments.

According to some embodiments of the present invention, a display apparatus includes: a thin-film transistor including a source electrode, a drain electrode, and a gate electrode; a data line in a layer different from the source electrode, the drain electrode, and the gate electrode, wherein the data line is configured to transmit a data signal; and a shield layer between the data line and a component of the thin-film transistor.

The shield layer may be between at least one of the source electrode and the data line, the drain electrode and the data line, or the gate electrode and the data line.

The display apparatus may further include a storage capacitor including a first storage capacitor plate and a second storage capacitor plate, the second storage capacitor plate overlapping the first storage capacitor plate and being above the first storage capacitor plate, the data line may be in a layer above the second storage capacitor plate, the second storage capacitor plate may include the shield layer, and the shield layer may extend between the gate electrode and the data line or extends below the data line.

The first storage capacitor plate may be electrically coupled to the gate electrode.

The first storage capacitor plate and the gate electrode may be integrally formed.

The gate electrode may include a first gate electrode and a second gate electrode, the shield layer may be between the data line and the component, and the component may be between the first gate electrode and the second gate electrode of the thin-film transistor.

The display apparatus may further include a storage capacitor including a first storage capacitor plate and a second storage capacitor plate, the second storage capacitor plate overlapping the first storage capacitor plate and being above the first storage capacitor plate, the data line may be in a layer above the second storage capacitor plate, and the second storage capacitor plate may include the shield layer and extend at least one of between the data line and the component, between the first gate electrode and the second gate electrode of the thin-film transistor, or below the data line.

The display apparatus may further include a driving thin-film transistor including a driving gate electrode electrically coupled to the first storage capacitor plate and a driving drain electrode electrically coupled to the source electrode, and the first storage capacitor plate may be electrically coupled to the drain electrode.

The display apparatus may further include: a storage capacitor including a first storage capacitor plate and a second storage capacitor plate, the second capacitor plate overlapping the first storage capacitor plate and being above the first storage capacitor plate; and an initialization voltage line configured to transmit an initialization voltage to a driving gate electrode electrically coupled to the first storage capacitor plate of a driving thin-film transistor, the initialization voltage line may be in a same layer as the second storage capacitor plate, the drain electrode may be electrically coupled to the first storage capacitor plate and the source electrode may be electrically coupled to the initialization voltage line, the data line may be in a layer above the second storage capacitor plate, and the shield layer may be integrated with the initialization voltage line and may extend at least one of between the data line and the component, above the component between the first gate electrode and the second gate electrode of the thin-film transistor, or below the data line.

According to some embodiments of the present invention, a display apparatus includes: a thin-film transistor including a source electrode, a drain electrode, and a gate electrode; a data line in a layer different from the source electrode, the drain electrode, and the gate electrode, wherein the data line is configured to transmit a data signal; a storage capacitor including: a first storage capacitor plate electrically coupled to the drain electrode; and a second storage capacitor plate in a layer different from the first storage capacitor plate, wherein the second storage capacitor plate overlaps the first storage capacitor plate; and an initialization voltage line configured to transmit an initialization voltage to a driving gate electrode electrically coupled to the first storage capacitor plate of a driving thin-film transistor and is electrically coupled to the source electrode, wherein the gate electrode includes a first gate electrode and a second gate electrode, and one of the first gate electrode and the second gate electrode is at least partially between the data line and a component between the first gate electrode and the second gate electrode of the thin-film transistor.

The one of the first gate electrode and the second gate electrode may extend below or above the data line.

According to some embodiments of the present invention, a display apparatus includes: a thin-film transistor including a source electrode, a drain electrode, and a gate electrode; a control signal line in a layer different from the source electrode, the drain electrode, and the gate electrode, and wherein the control signal line is configured to transmit a control signal; and a shield layer between the control signal line and a component of the thin-film transistor.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
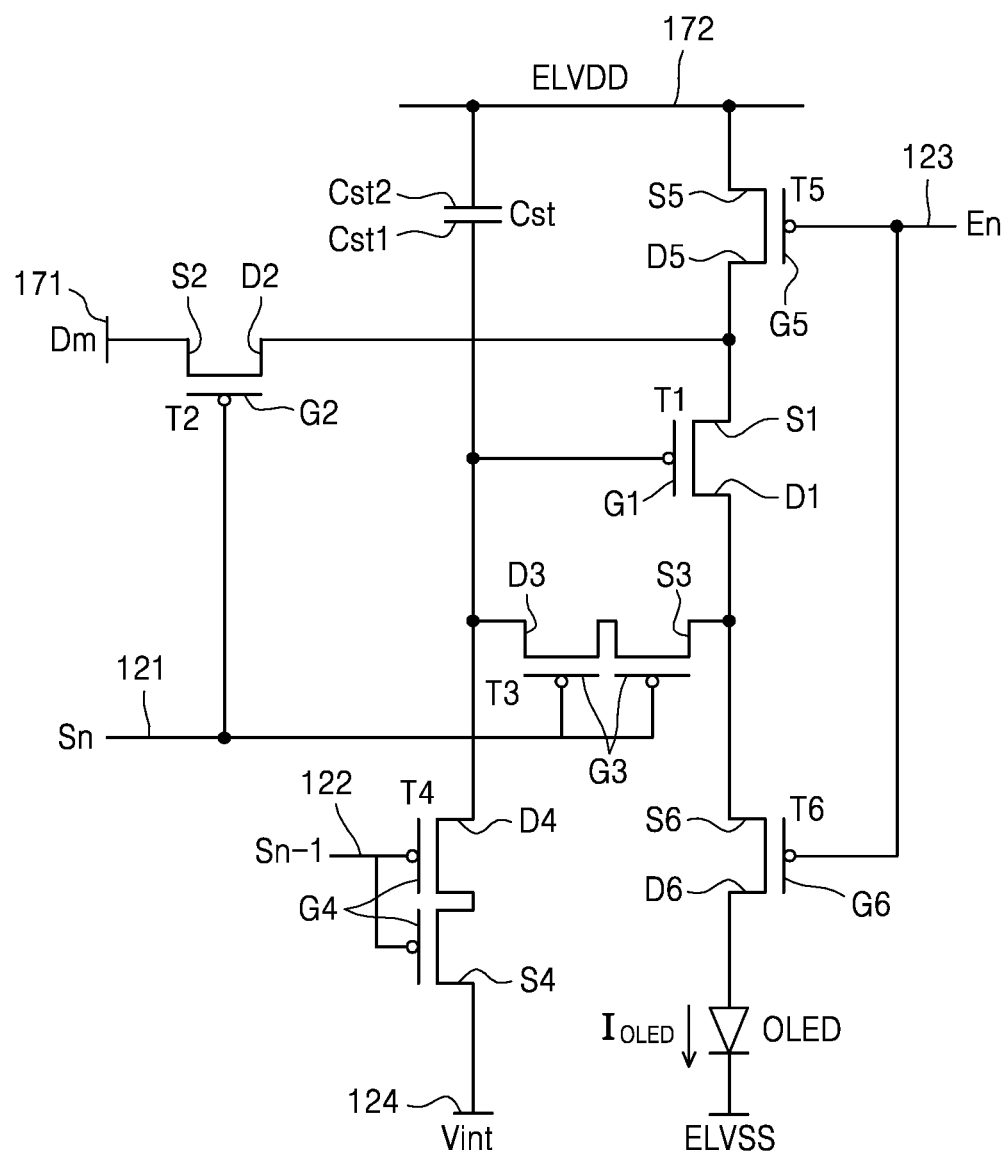
FIG. 1 is a circuit diagram of a (sub) pixel of an organic light-emitting display apparatus, according to an embodiment of the present invention.

Aspects and features of one or more embodiments of the present invention and methods of accomplishing the same may be understood more readily by reference to the following detailed description of the embodiments and the accompanying drawings. In this regard, the present embodiments may have different forms and should not be construed as being limited to the descriptions set forth herein. Rather, these embodiments are provided so that this disclosure will be more thorough and complete and will more fully convey the concepts of the present embodiments to one of ordinary skill in the art, and the present invention will only be defined by the appended claims and their equivalents.

Hereinafter, one or more embodiments of the present invention will be described below in more detail with reference to the accompanying drawings. Those components that are the same or are in correspondence are rendered the same reference numeral regardless of the figure number, and redundant explanations are omitted.

It will be understood that when a layer, region, or component is referred to as being "formed on," another layer, region, or component, it can be directly or indirectly formed on the other layer, region, or component. That is, for example, intervening layers, regions, or components may be present. Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

As used herein, the term "and/or" includes any and all combinations of one or more of the associated listed items.

FIG. 1 is an equivalent circuit diagram of a (sub) pixel of an organic light-emitting display apparatus, according to some embodiments of the present invention.

As shown in FIG. 1, the (sub) pixel of the organic light-emitting display apparatus according to an embodiment includes a plurality of signal lines, a plurality of thin-film transistors (TFTs) coupled to the plurality of signal lines, a storage capacitor Cst, and an organic light-emitting device OLED. Here, the plurality of signal lines may be shared by a plurality of (sub) pixels.

The plurality of TFTs include a driving TFT T1, a switching TFT T2, a compensating TFT T3, an initialization TFT T4, an operation control TFT T5, and an emission control TFT T6.

The plurality of signal lines include a scan line 121 transmitting a scan signal Sn, a previous scan line 122 transmitting a previous scan line Sn−1 to the initialization TFT T4, an emission control line 123 transmitting an emission control signal En to the operation control TFT T5 and the emission control TFT T6, a data line 171 crossing the scan line 121 and transmitting a data signal Dm, a driving voltage line 172 transmitting a driving voltage ELVDD and disposed almost in parallel to the data line 171, and an initialization voltage line 124 transmitting an initialization voltage Vint for initializing the driving TFT T1.

A gate electrode G1 of the driving TFT T1 is coupled to a first storage capacitor plate Cst1 of the storage capacitor Cst, a source electrode S1 of the driving TFT T1 is coupled to the driving voltage line 172 through the operation control TFT T5, and a drain electrode D1 of the driving TFT T1 is electrically coupled to a pixel electrode of the organic light-emitting device OLED through the emission control TFT T6. According to a switching operation of the switching TFT T2, the driving TFT T1 receives the data signal Dm and supplies a driving current $I_{OLED}$ to the organic light-emitting device OLED.

A gate electrode G2 of the switching TFT T2 is coupled to the scan line 121, a source electrode S2 of the switching TFT T2 is coupled to the data line 171, and a drain electrode D2 of the switching TFT T2 is coupled to the source electrode S1 of the driving TFT T1 and coupled to the driving voltage line 172 through the operation control TFT T5. Such a switching TFT T2 is turned on according to the scan signal Sn received through the scan line 121, and performs a switching operation by transmitting the data signal Dm from the data line 171 to the source electrode S1 of the driving TFT T1.

A gate electrode G3 of the compensation TFT T3 is coupled to the scan line 121, a source electrode S3 of the compensating TFT T3 is coupled to the drain electrode D1 of the driving TFT T1 while being coupled to the pixel electrode of the organic light-emitting device OLED through the emission control TFT T6, and a drain electrode D3 of the compensating TFT T3 is coupled to the first storage capacitor plate Cst1 of the storage capacitor Cst, a drain electrode D4 of the initialization TFT T4, and the gate electrode G1 of the driving TFT T1. Such a compensating TFT T3 is turned on according to the scan signal Sn received through the scan line 121, and diode-connects the driving TFT T1 by electrically coupling the gate electrode G1 and the drain electrode D1 of the driving TFT T1.

A gate electrode G4 of the initialization TFT T4 is coupled to the previous scan line 122, a source electrode S4 of the initialization TFT T4 is coupled to the initialization voltage line 124, and the drain electrode D4 of the initialization TFT T4 is coupled to the first storage capacitor plate Cst1 of the storage capacitor Cst, the drain electrode D3 of the compensating TFT T3, and the gate electrode G1 of the driving TFT T1. The initialization TFT T4 is turned on according to the previous scan signal Sn−1 received through the previous scan line 122, and performs an initialization operation by initializing a voltage of the gate electrode G1 of the driving TFT T1 by transmitting the initialization voltage Vint to the gate electrode G1 of the driving TFT T1.

A gate electrode G5 of the operation control TFT T5 is coupled to the emission control line 123, a source electrode S5 of the operation control TFT T5 is coupled to the driving voltage line 172, and a drain electrode D5 of the operation control TFT T5 is coupled to the source electrode S1 of the driving TFT T1 and the drain electrode D2 of the switching TFT T2.

A gate electrode G6 of the emission control TFT T6 is coupled to the emission control line 123, a source electrode S6 of the emission control TFT T6 is coupled to the drain electrode D1 of the driving TFT T1 and the source electrode S3 of the compensating TFT T3, and a drain electrode D6 of the emission control TFT T6 is electrically coupled to the pixel electrode of the organic light-emitting device OLED. The operation control TFT T5 and an emission control TFT T6 are concurrently (e.g., simultaneously) turned on according to the emission control signal En received through the emission control line 123, and transmit the driving voltage ELVDD to the organic light-emitting device OLED such that the driving current $I_{OLED}$ flows through the organic light-emitting device OLED.

A second storage capacitor plate Cst2 of the storage capacitor Cst is coupled to the driving voltage line 172, and a counter electrode of the organic light-emitting device OLED is coupled to a common voltage ELVSS. Accordingly, the organic light-emitting device OLED emits light by receiving the driving current $I_{OLED}$ from the driving TFT T1, thereby displaying an image.

Detailed operations of a pixel in such an organic light-emitting display apparatus will now be briefly described.

First, the previous scan signal Sn−1 in a low level is supplied through the previous can line 122 during an initialization period. Then, the initialization TFT T4 is turned on in response to the previous scan signal Sn−1 in the low level, and thus the initialization voltage Vint is transmitted to the gate electrode G1 of the driving TFT T1 from the initialization voltage line 124 through the initialization TFT T4, and the driving TFT T1 is initialized by the initialization voltage Vint.

Then, the scan signal Sn in a low level is supplied through the scan line 121 during a data programming period. Accordingly, the switching TFT T1 and the compensating TFT T3 are turned on in response to the scan signal Sn in the low level. Thus, the driving TFT T1 is diode-coupled by the turned on compensating TFT T3 and is biased in a forward direction. Then, a compensating voltage (Dm+Vth, wherein Vth has a negative value) obtained by subtracting a threshold voltage Vth of the driving TFT T1 from the data signal Dm supplied from the data line 171 is applied to the gate electrode G1. Next, the driving voltage ELVDD and the compensating voltage are applied to two ends of the storage capacitor Cst, and thus a charge corresponding to a voltage difference between the two ends is stored in the storage capacitor Cst.

Then, the emission control signal En supplied from the emission control line 123 during an emission period is changed from a high level to a low level. Accordingly, the operation control TFT T5 and the emission control TFT T6 are turned on according to the emission control signal En in the low level during the emission period. Then, the driving current $I_{OLED}$ determined based on a voltage difference between a voltage of the gate electrode G1 of the driving TFT T1 and the driving voltage ELVDD is generated, and the driving current $I_{OLED}$ is supplied to the organic light-emitting device OLED through the emission control TFT T6. A gate-source voltage $V_{GS}$ of the driving TFT T1 maintains '(Dm+Vth)-ELVDD' by the storage capacitor Cst during the emission period, and because the driving current $I_{OLED}$ is proportional to '(Dm-ELVDD)$^2$' (i.e., a square of a value obtained by subtracting the threshold voltage Vth from the gate-source voltage $V_{GS}$, according to a current-voltage relationship of the driving TFT T1), the driving current $I_{OLED}$ may be determined regardless of the threshold voltage Vth of the driving TFT T1.

A more detailed structure of the (sub) pixel of the organic light-emitting display apparatus of FIG. 1 will now be described with reference to FIGS. 2 through 10.

Figure 2:
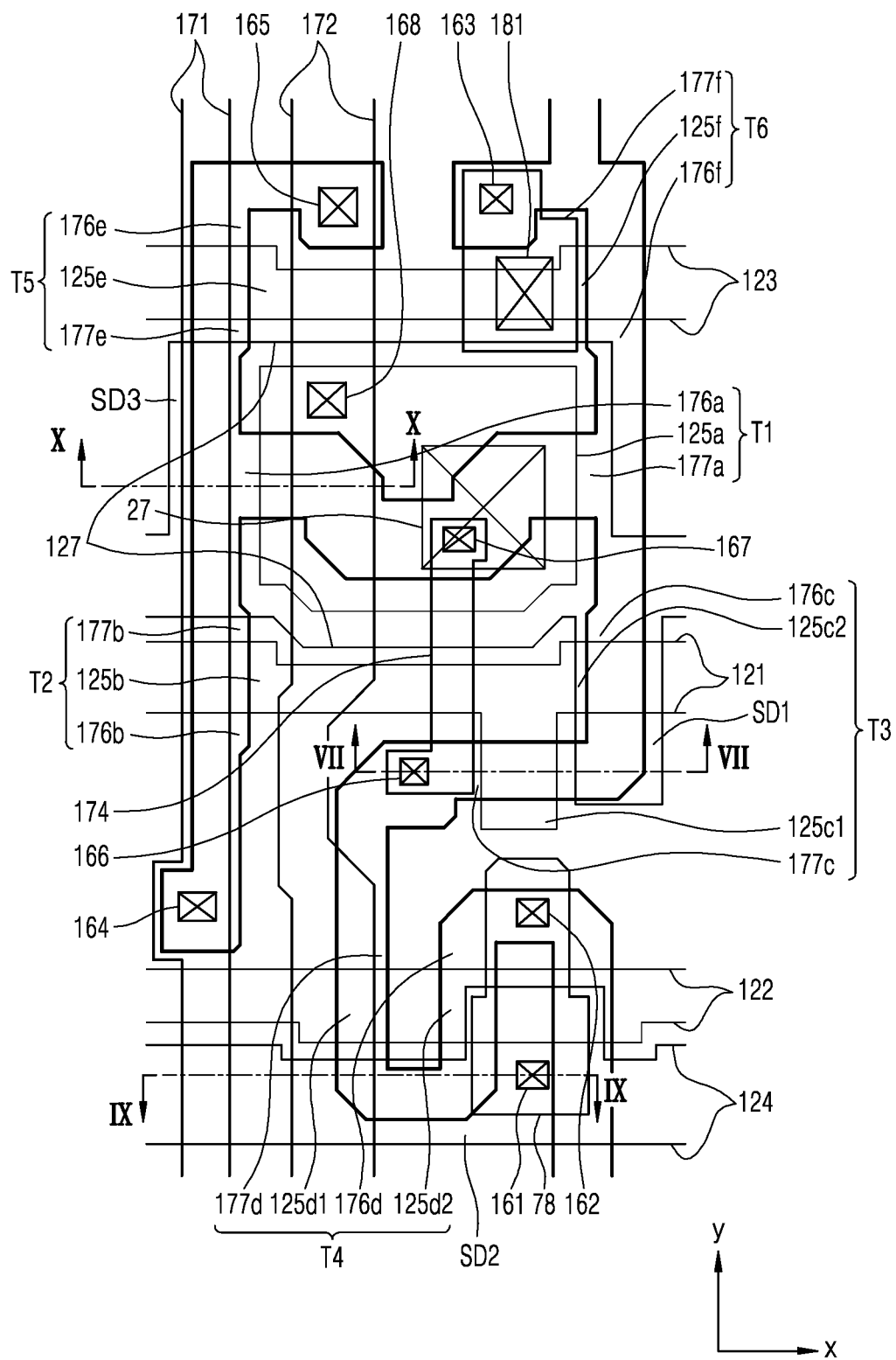
FIG. 2 is a schematic diagram showing locations of a plurality of thin-film transistors (TFTs) and a capacitor in the (sub) pixel of FIG. 1, according to an embodiment of the present invention.

FIG. 2 is a schematic diagram showing locations of the plurality of TFTs and the capacitor in the (sub) pixel of FIG. 1, according to an embodiment of the present invention. FIGS. 3 through 6 are schematic diagrams showing components of the plurality of TFTs and the capacitor of FIG. 2 by each layer. In other words, each of FIGS. 3 through 6 illustrates an arrangement of a wire or a semiconductor layer disposed in the same layer, and an insulating layer may be located between layers shown in FIGS. 3 through 6. For example, a first insulating layer 141 of FIG. 7 may be located between the layer of FIG. 3 and the layer of FIG. 4, a second insulating layer 142 of FIG. 7 may be located between the layer of FIG. 4 and the layer of FIG. 5, and an interlayer insulating layer 160 of FIG. 7 may be located between the layer of FIG. 5 and the layer of FIG. 6. Here, contact holes etc. may be formed on such insulating layers so that the layers of FIGS. 3 through 6 are electrically coupled to each other.

The (sub) pixel of the organic light-emitting display apparatus, according to the current embodiment, includes the scan line 121, the previous scan line 122, the emission control line 123, and the initialization voltage line 124, which respectively apply the scan signal Sn, the previous scan signal Sn−1, the emission control signal En, and the initialization voltage Vint and are formed along a row direction. Also, the (sub) pixel of the organic light-emitting display apparatus, according to the current embodiment, may include the data line 171 and the driving voltage line 172, which cross the scan line 121, the previous scan line 122, the emission control line 123, and the initialization voltage line 124, and respectively apply the data signal Dm and the driving voltage ELVDD to the (sub) pixel.

Also, the (sub) pixel may include the driving TFT T1, the switching TFT T2, the compensating TFT T3, the initialization TFT T4, the operation control TFT T5, the emission control TFT T6, the storage capacitor Cst, and an organic light-emitting device.

Figure 3:
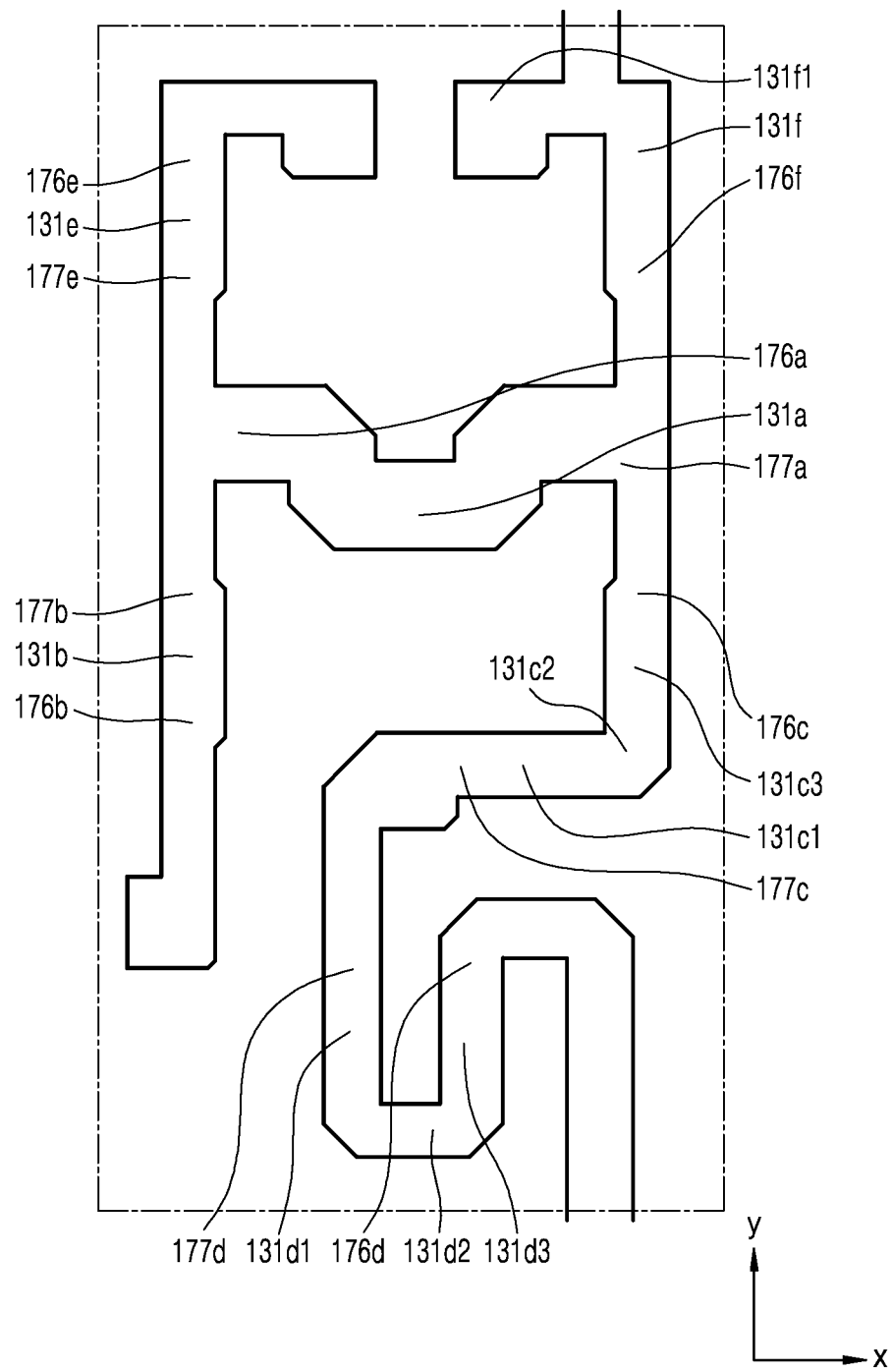
FIGS. 3 through 6 are schematic diagrams showing components of the plurality of TFTs and the capacitor of FIG. 2 by each layer.

The driving TFT T1, the switching TFT T2, the compensating TFT T3, the initialization TFT T4, the operation control TFT T5, and the emission control TFT T6 are formed on a semiconductor layer as shown in FIG. 3, wherein the semiconductor layer may have a shape curving or contouring in any shape. The semiconductor layer may include a driving semiconductor layer 131a corresponding to the driving TFT T1, a switching semiconductor layer 131*b* corresponding to the switching TFT T2, a compensating semiconductor layer 131*c*1, 131*c*2, and 131*c*3 corresponding to the compensating TFT T3, initialization semiconductor layer 131*d*1, 131*d*2, and 131*d*3 corresponding to the initialization TFT T4, an operation control semiconductor layer 131*e* corresponding to the operation control TFT T5, and an emission control semiconductor layer 131*f* corresponding to the emission control TFT T6. In other words, the driving semiconductor layer 131*a*, the switching semiconductor layer 131*b*, the compensating semiconductor layer 131*c*1, 131*c*2, and 131*c*3, the initialization semiconductor layer 131*d*1 through 131*d*3, the operation control semiconductor layer 131*e*, and the emission control semiconductor layer 131*f* may be understood to constitute partial regions of the semiconductor layer of FIG. 3.

The semiconductor layer may include polysilicon. Also, the semiconductor layer may include, for example, a channel region that is not doped with an impurity, and source and drain regions that are formed as impurities are doped on two sides of the channel region. Here, the impurities may vary according to a type of a TFT, and may be N-type impurities or P-type impurities. Also, the source or drain region may be interpreted as a source or drain electrode of a TFT. In other words, for example, a driving source electrode 176*a* may correspond to a driving drain region doped with an impurity near the driving semiconductor layer 131*a* of the semiconductor layer of FIG. 3, and a driving drain electrode 177*a* may correspond to a driving drain region doped with an impurity near the driving semiconductor layer 131*a* of the semiconductor layer of FIG. 3. Also, a region of the semiconductor layer of FIG. 3 between TFTs may be doped with an impurity to operate as a wire electrically coupling the TFTs.

Meanwhile, the storage capacitor Cst may be formed. The storage capacitor Cst may include a first storage capacitor plate 125*a* and a second storage capacitor plate 127, wherein the second insulating layer 142 is located therebetween. Here, the first storage capacitor plate 125*a* may also operate as a driving gate electrode of the driving TFT T1. In other words, the driving gate electrode and the first storage capacitor plate 125*a* may be integrally formed. Hereinafter, for convenience, the same reference numeral as the first storage capacitor plate 125*a* may be used for the driving gate electrode.

Figure 4:
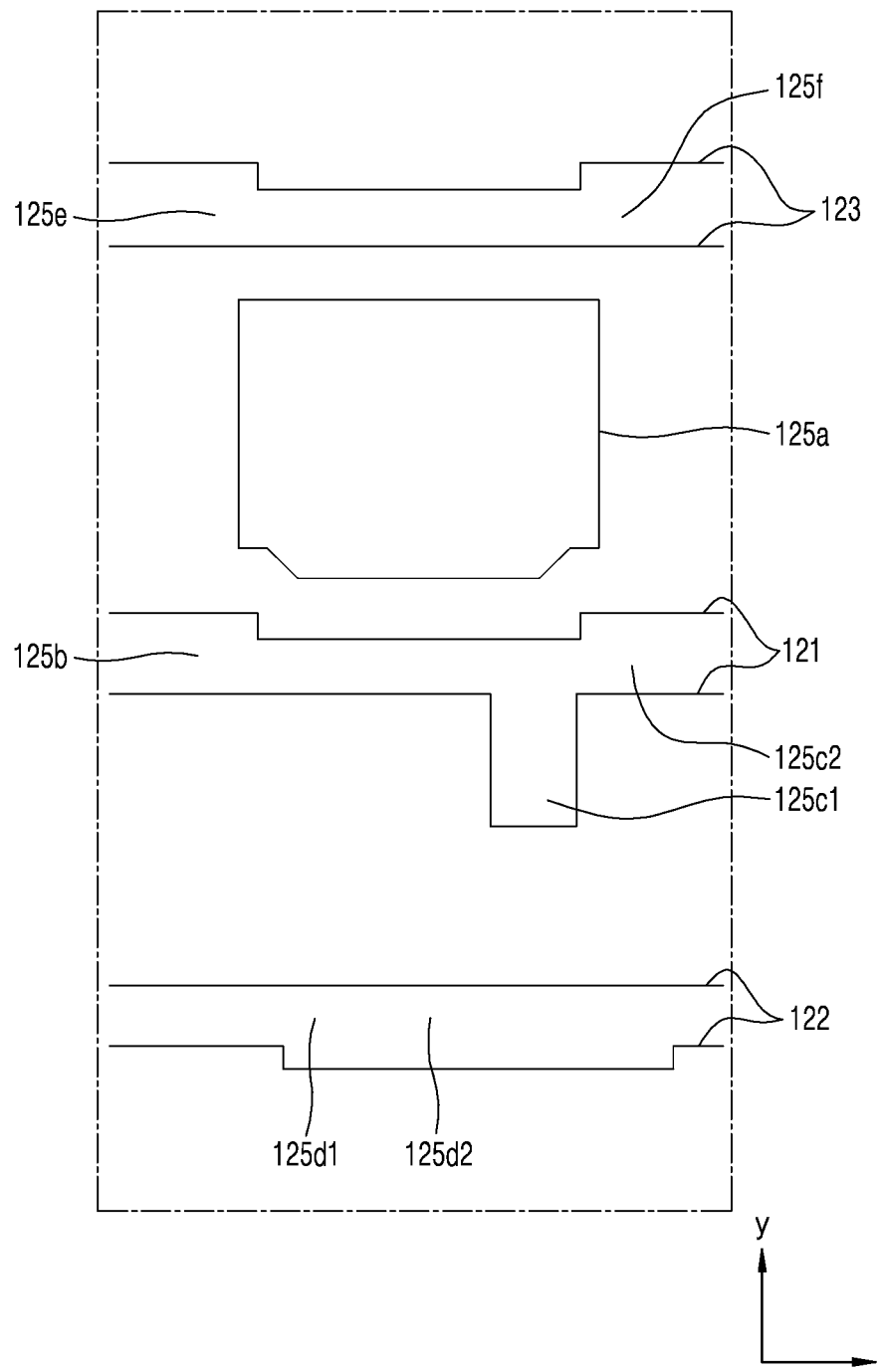

The first storage capacitor plate 125*a* may have a rectangular shape isolated from an adjacent (sub) pixel as shown in FIG. 4. Such a first storage capacitor plate 125*a* may be formed in the same layer and of the same material as the scan line 121, the previous scan line 122, and the emission control line 123 as shown in FIG. 4.

For reference, a switching gate electrode 125*b* and a compensating gate electrode 125*c*1 and 125*c*2 may be a part of the scan line 121 crossing the semiconductor layer or a part protruding from the scan line 121, an initialization gate electrode 125*d*1 and 125*d*2 may be parts of the previous scan line 122 crossing the semiconductor layer or parts protruding from the previous scan line 122, and an operation control gate electrode 125*e* and an emission control gate electrode 125*f* may be parts of the emission control line 123 crossing the semiconductor layer or parts protruding from the emission control line 123.

Figure 5:
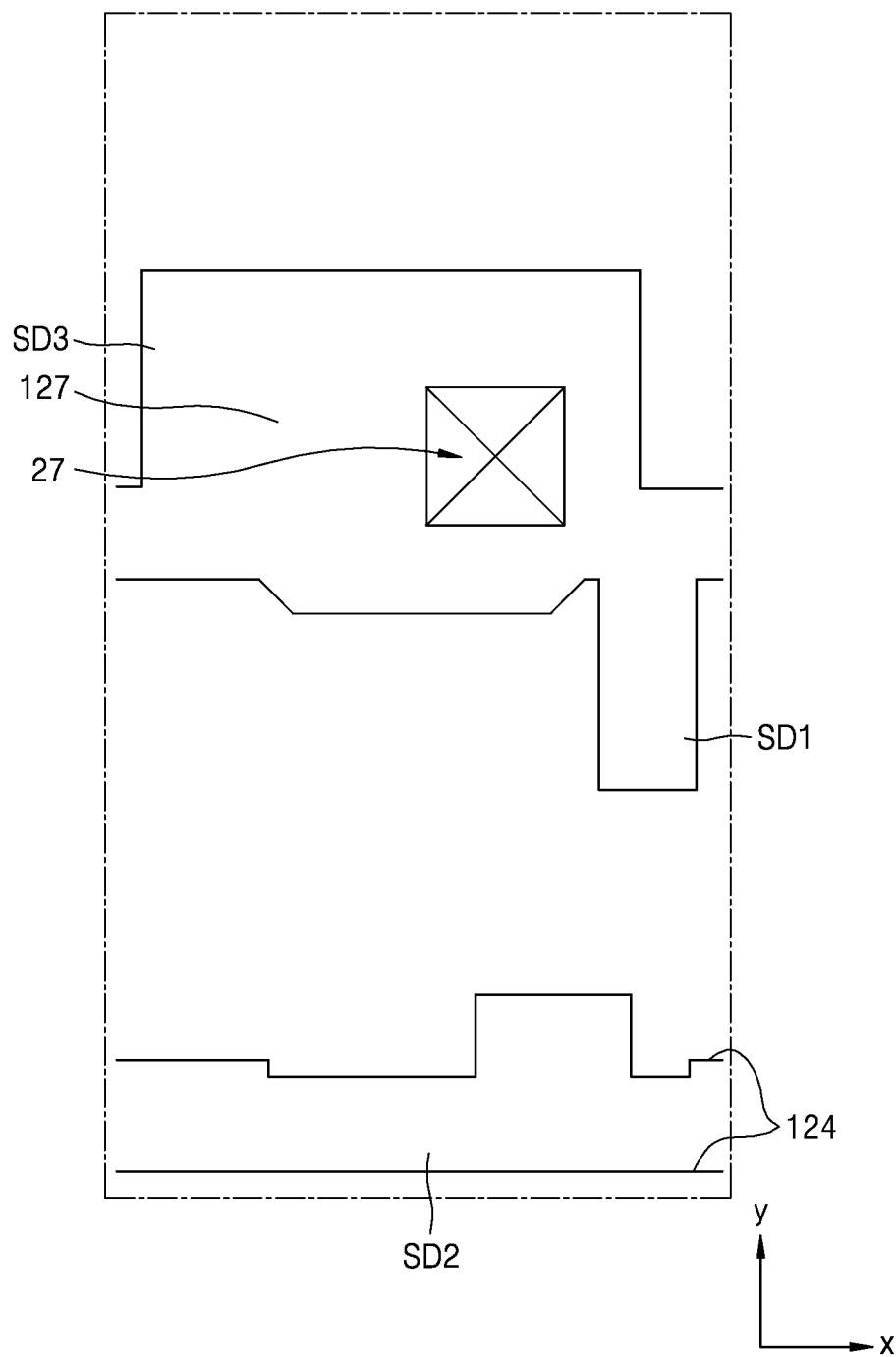

The second storage capacitor plates 127 of adjacent (sub) pixels may be coupled to each other, and as shown in FIG. 5, may be formed in the same layer and of the same material as the initialization voltage line 124. A storage opening 27 may be formed on the second storage capacitor plate 127 and may enable the first storage capacitor plate 125*a* and a compensating drain electrode 177*c* of the compensating TFT T3 to be electrically coupled to each other through a connecting unit 174 described in more detail later. The second storage capacitor plate 127 may be coupled to the driving voltage line 172 through a contact hole 168 formed on the interlayer insulating layer 160.

The driving TFT T1 includes the driving semiconductor layer 131*a*, the driving gate electrode 125*a*, the driving source electrode 176*a*, and the driving drain electrode 177*a*. As described above, the driving gate electrode 125*a* may also operate as the first storage capacitor plate 125*a*. The driving source electrode 176*a* is an external region (in −x direction in FIG. 3) of the driving gate electrode 125*a*, and the driving drain electrode 177*a* is an external region (in +x direction in FIG. 3) of the driving gate electrode 125*a* and is arranged opposite to the driving source electrode 176*a* based on the driving gate electrode 125*a*.

The switching TFT T2 includes the switching semiconductor layer 131*b*, the switching gate electrode 125*b*, a switching source electrode 176*b*, and a switching drain electrode 177*b*. The switching source electrode 176*b* may be electrically coupled to the data line 171 through a contact hole 164 formed through the first insulating layer 141, the second insulating layer 142, and the interlayer insulating layer 160. Here, if required, a part near the contact hole 164 of the data line 171 may be understood to be the source electrode S2 of the switching TFT T2. The switching drain electrode 177*b* corresponds to a switching drain region doped with an impurity near the switching semiconductor layer 131*b*.

The compensating TFT T3 includes the compensating semiconductor layer 131*c*1, 131*c*2, and 131*c*3, the compensating gate electrode 125*c*1 and 125*c*2, a compensating source electrode 176*c*, and the compensating drain electrode 177*c*. The compensating source electrode 176*c* corresponds to a compensating source region doped with an impurity near the compensating semiconductor layer, and the compensating drain electrode 177*c* corresponds to a compensating drain region doped with an impurity near the compensating semiconductor layer. The compensating gate electrode 125*c*1 and 125*c*2 is a dual gate electrode including a first gate electrode 125*c*1 and a second gate electrode 125*c*2, and may prevent or reduce generation of a leakage current. The compensating drain electrode 177*c* of the compensating TFT T3 may be coupled to the first storage capacitor plate 125*a* through the connecting unit 174. The compensating semiconductor layer may include a part or component 131*c*1 corresponding to the first gate electrode 125*c*1, a part or component 131*c*3 corresponding to the second gate electrode 125*c*2, and a part or component 131*c*2 between the parts 131*c*1 and 131*c*3.

Figure 6:
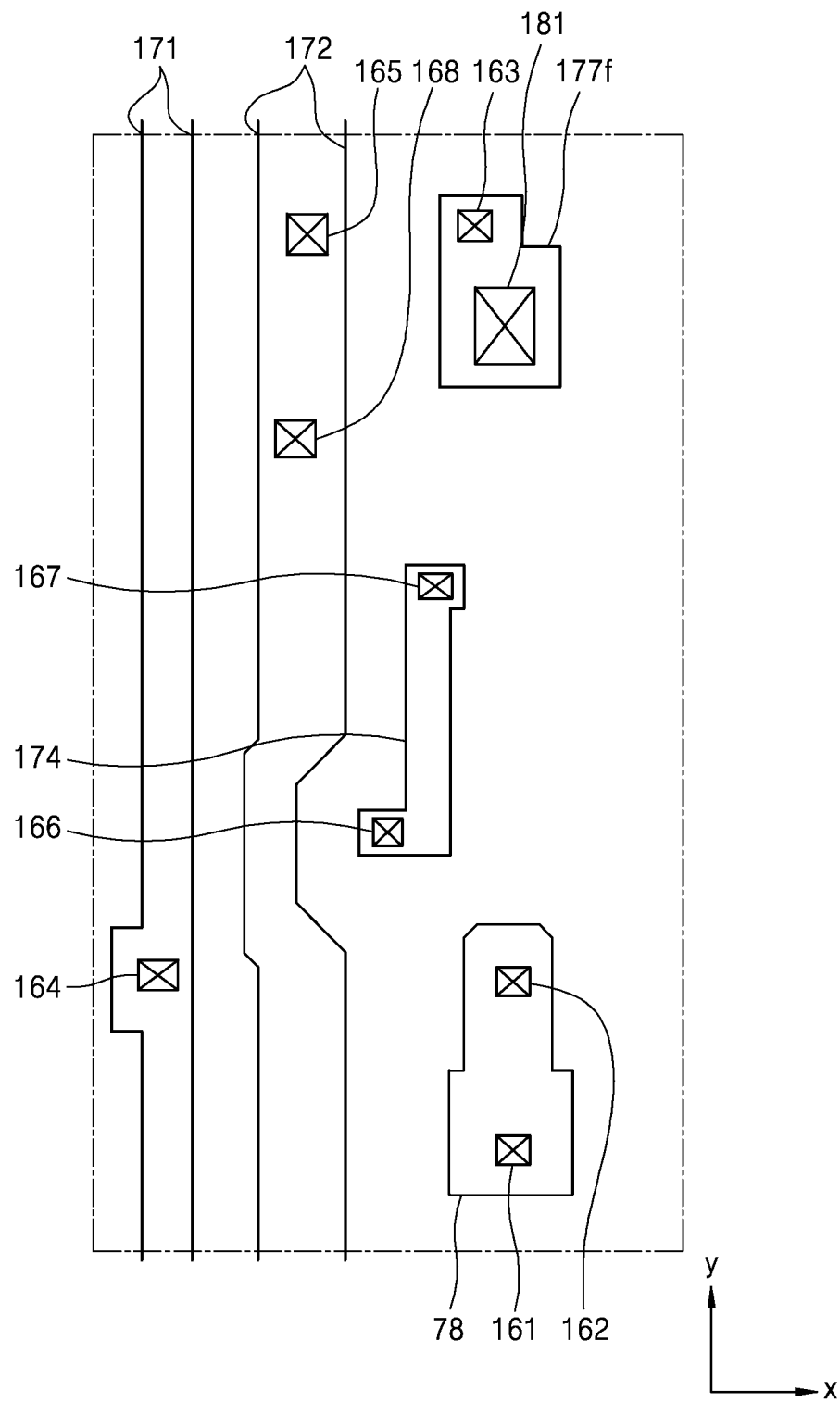

As shown in FIG. 6, the connecting unit 174 may be formed of the same material and in the same layer as the data line 171. One end of the connecting unit 174 is coupled to the compensating drain electrode 177*c* and an initialization drain electrode 177*d* through a contact hole 166 formed through the first insulating layer 141, the second insulating layer 142, and the interlayer insulating layer 160, and the other end of the connecting unit 174 is coupled to the first storage capacitor plate 125*a* through a contact hole 167 formed through the second insulating layer 142 and the interlayer insulating layer 160. Here, the other end of the connecting unit 174 is coupled to the first storage capacitor plate 125*a* through the storage opening 27 formed on the second storage capacitor plate 127.

The initialization TFT T4 includes an initialization semiconductor layer 131d1, 131d2, and 131d3, an initialization gate electrode 125d1 and 125d2, an initialization source electrode 176d, and the initialization drain electrode 177d. The initialization drain electrode 177d corresponds to an initialization drain region doped with an impurity near the initialization semiconductor layer 131d1, 131d2, and 131d3.

The initialization source electrode 176d is coupled to the initialization voltage line 124 through an initialization connecting line 78. One end of the initialization connecting line 78 may be coupled to the initialization voltage line 124 through a contact hole 161 formed through the second insulating layer 142 and the interlayer insulating layer 160, and the other end of the initialization connecting line 78 may be coupled to the initialization source electrode 176d through a contact hole 162 formed through the first insulating layer 141, the second insulating layer 142, and the interlayer insulating layer 160.

The operation control TFT T5 includes the operation control semiconductor layer 131e, the operation control gate electrode 125e, an operation control source electrode 176e, and an operation control drain electrode 177e. The operation control source electrode 176e may be electrically coupled to the driving voltage line 172 through a contact hole 165 formed through the first insulating layer 141, the second insulating layer 142, and the interlayer insulating layer 160. Here, if required, a part near the contact hole 165 of the driving voltage line 172 may be understood to be the source electrode S5 of the operation control TFT T5. The operation control drain electrode 177e corresponds to an operation control drain region doped with an impurity near the operation control semiconductor layer 131e.

The emission control TFT T6 includes the emission control semiconductor layer 131f, the emission control gate electrode 125f, an emission control source electrode 176f, and an emission control drain electrode 177f. The emission control source electrode 176f corresponds to an emission control source region doped with an impurity near the emission control semiconductor layer 131f. As shown in FIG. 6, the emission control drain electrode 177f may be understood to be a part formed on the interlayer insulating layer 160 together with the data line 171 or the driving voltage line 172. The emission control drain electrode 177f may be coupled to a lower semiconductor layer through a contact hole 163 formed through the first insulating layer 141, the second insulating layer 142, and the interlayer insulating layer 160. Alternatively, it may be understood that a part of the lower semiconductor layer is a emission control drain electrode, and the reference numeral 177f denote an intermediate connection layer for coupling the emission control drain electrode and the pixel electrode of the organic light-emitting device OLED.

One end of the driving semiconductor layer 131a of the driving TFT T1 is coupled to the switching semiconductor layer 131b and the compensating semiconductor layer, and the other end of the driving semiconductor layer 131a is coupled to the operation control semiconductor layer 131e and the emission control semiconductor layer 131f. Accordingly, the driving source electrode 176a is coupled to the switching drain electrode 177b and the operation control drain electrode 177e, and the driving drain electrode 177a is coupled to the compensating source electrode 176c and the emission control source electrode 176f.

Meanwhile, the switching TFT T2 is used as a switching device for selecting a (sub) pixel to emit light. The switching gate electrode 125b is coupled to the scan line 121, the switching source electrode 176b is coupled to the data line 171, and the switching drain electrode 177b is coupled to the driving TFT T1 and the operation control TFT T5.

Also, as shown in FIG. 6, the emission control drain electrode 177f of the emission control TFT T6 is coupled to the pixel electrode of the organic light-emitting device OLED through a contact hole 181 formed on a passivation film or planarization film covering the data line 171 or the driving voltage line 172 formed in the same layer.

Figure 7:
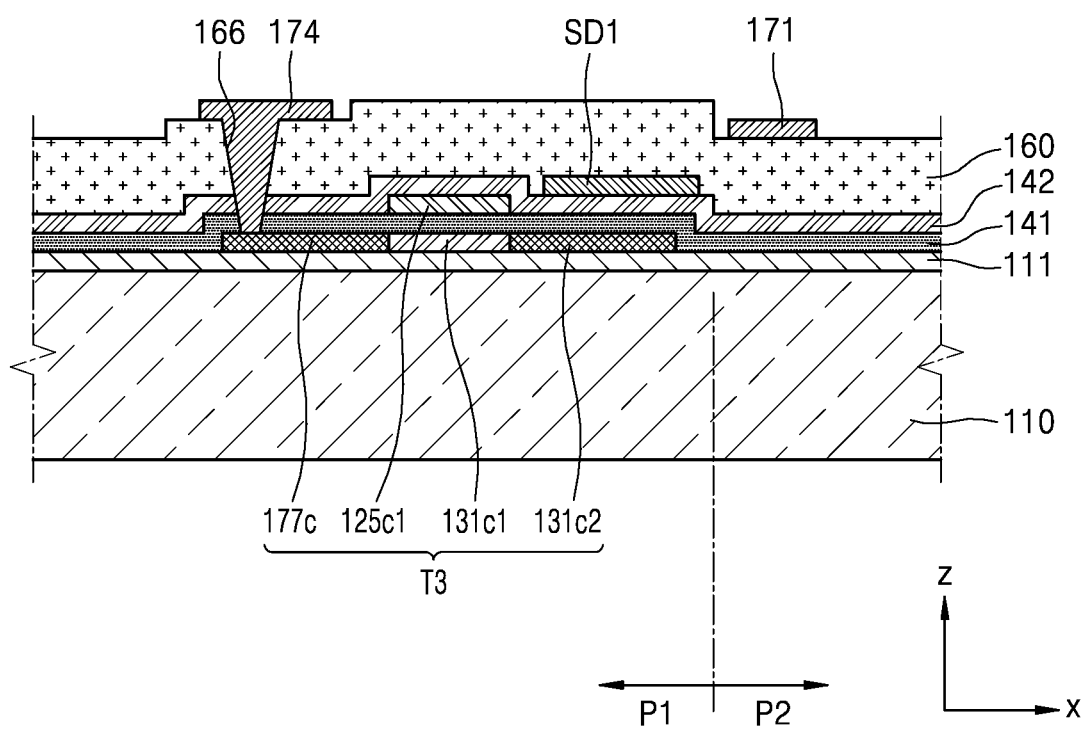
FIG. 7 is a cross-sectional view taken along the line VII-VII of FIG. 2.

FIG. 7 is a cross-sectional view taken along the line VII-VII of FIG. 2. As shown in FIG. 7, various components described above may be arranged on a substrate 110. The substrate 110 may be formed of any one of various suitable substrate materials, such as glass, a metal, and plastic. A buffer layer 111 may be disposed on the substrate 110 as occasion demands. The buffer layer 111 may flatten a surface of the substrate 110 or prevent impurities from penetrating into a semiconductor layer on the substrate 110. Such a buffer layer 111 may be a single layer or multilayer structure formed of silicon oxide, silicon nitride, or silicon oxynitride.

The driving semiconductor layer 131a, the switching semiconductor layer 131b, and the compensating semiconductor layer described above with reference to FIG. 3 may be arranged on the buffer layer 111. The first insulating layer 141 formed of silicon nitride, silicon oxide, or silicon oxynitride may be arranged on the driving semiconductor layer 131a, the switching semiconductor layer 131b, and the compensating semiconductor layer.

Wires including the driving gate electrode 125a, the scan line 121 including the switching gate electrode 125b and the compensating gate electrode 125c1 and 125c2, the previous scan line 122 including the initialization gate electrode 125d1 and 125d2, the emission control line 123 including the operation control gate electrode 125e and the emission control gate electrode 125f, which have been described above with reference to FIG. 4, may be arranged on the first insulating layer 141. The driving gate electrode 125a, the scan line 121, the previous scan line 122, and the emission control line 123 may be collectively referred to as a first gate wire.

The second insulating layer 142 may cover the first gate wire. The second insulating layer 142 may be formed of silicon nitride, silicon oxide, or silicon oxynitride. The second storage capacitor plate 127 and the initialization voltage line 124 described above with reference to FIG. 5 may be arranged on the second insulating layer 142. The second storage capacitor plate 127 and the initialization voltage line 124 may be collectively referred to as a second gate wire.

The interlayer insulating layer 160 is disposed on the second gate wire. The interlayer insulating layer 160 may be formed of silicon nitride, silicon oxide, or silicon oxynitride.

The data line 171, the driving voltage line 172, the connecting unit 174, the initialization connecting line 78, and the emission control drain electrode 177f, which have been described above with reference to FIG. 6, may be arranged on the interlayer insulating layer 160. The data line 171, the driving voltage line 172, the connecting unit 174, the initialization connecting line 78, and the emission control drain electrode 177f may be collectively referred to as a data wire. As described above, the data line 171, the driving voltage line 172, the connecting unit 174, the initialization connecting line 78, and the emission control drain electrode 177f may be electrically coupled to a lower semiconductor layer or an electrode through the contact holes 161 through 168 formed on at least a part of the first insulating layer 141, the second insulating layer 142, and the interlayer insulating layer 160.

A passivation film or planarization film is disposed on the data wire, and a pixel electrode of an organic light-emitting device may be arranged on the passivation film or planarization film. The pixel electrode may be coupled to the emission control drain electrode 177*f* through the contact hole 181 formed on the passivation film or planarization film.

Meanwhile, as shown in FIGS. 2, 5, and 7, the second storage capacitor plate 127 may include a first shield layer SD1 at one side. As shown in FIGS. 2 and 5, the first shield layer SD1 may be a part protruding from the second storage capacitor plate 127. The first shield layer SD1 may be understood as a part of the second storage capacitor plate 127, which extends between the data line 171 and at least a part between the first gate electrode 125*c*1 and the second gate electrode 125*c*2 of the compensating TFT T3.

For reference, FIG. 2 is a diagram of one (sub) pixel, and a (sub) pixel having the same or similar structure may be disposed top, bottom, left, and right of the (sub) pixel. In FIG. 7, a (sub) pixel P1 corresponds to the (sub) pixel of FIG. 2, and a part of a (sub) pixel P2 disposed next to the (sub) pixel P1 in the +x direction of FIG. 2 are illustrated. The (sub) pixel P2 may also include the data line 171, and accordingly, the first shield layer SD1 of the (sub) pixel P1 may be understood to be a part of the second storage capacitor plate 127, which extends between the data line 171 of the (sub) pixel P2 and at least a part between the first and second gate electrodes 125*c*1 and 125*c*2 of the compensating TFT T3.

If the first shield layer SD1 does not exist, the components between the first and second gate electrodes 125*c*1 and 125*c*2 of the compensating TFT T3, for example, the part 131*c*2 of the compensating semiconductor layer, may be affected by the data line 171.

The data line 171 transmits a data signal to the (sub) pixel P2 disposed near the (sub) pixel P1 in the +x direction, and also transmits a data signal to a plurality of (sub) pixels disposed near the (sub) pixel P2 in +y and −y directions. Here, a data signal being transmitted may vary according to luminance to be realized in the plurality of (sub) pixels disposed near the (sub) pixel P2 in the +y and −y directions, and accordingly, the data line 171 near the part 131*c*2 of the compensating semiconductor layer of the (sub) pixel P1 may transmit different electric signals according to time while the (sub) pixel P1 emits light.

If the first shield layer SD1 does not exist, parasitic capacitance may occur between the data line 171 of the (sub) pixel P2 and the part 131*c*2 of the compensating TFT T3 of the (sub) pixel P1, and accordingly, the electric potential of the part 131*c*2 of the compensating TFT T3 of the (sub) pixel P1 may be affected by different electric signals transmitted by the data line 171 of the (sub) pixel P2 according to time while the (sub) pixel P1 emits light. Because the compensating TFT T3 is electrically coupled to the driving TFT T1, if the electric potential of the part 131*c*2 of the compensating TFT T3 of the (sub) pixel P1 is affected by the different electric signals transmitted by the data line 171 of the (sub) pixel P2, the luminance of the organic light-emitting device OLED determined by the driving TFT T1 may become different from an initial intension, and thus quality of an image displayed by the organic light-emitting display apparatus may deteriorate.

However, according to the organic light-emitting display apparatus of some embodiments, because the first shield layer SD1 is disposed between the data line 171 of the (sub) pixel P2 and the part 131*c*2 of the compensating TFT T3 of the (sub) pixel P1, the part 131*c*2 of the compensating TFT T3 of the (sub) pixel P1 may not be affected or may be less affected by the data line 171 of the (sub) pixel P2, and thus the organic light-emitting display apparatus may be able to display an image having a more accurate luminance and a relatively higher quality. For example, if the first shield layer SD1 is a part of the second storage capacitor plate 127, the second storage capacitor plate 127 is connected to the driving voltage line 172 always having uniform electric potential, through the contact hole 168, and thus the first shield layer SD1 may also always have a uniform electric potential. Accordingly, an effect of an adjacent electric signal on the part 131*c*2 of the compensating TFT T3 may be reduced.

Figure 8:
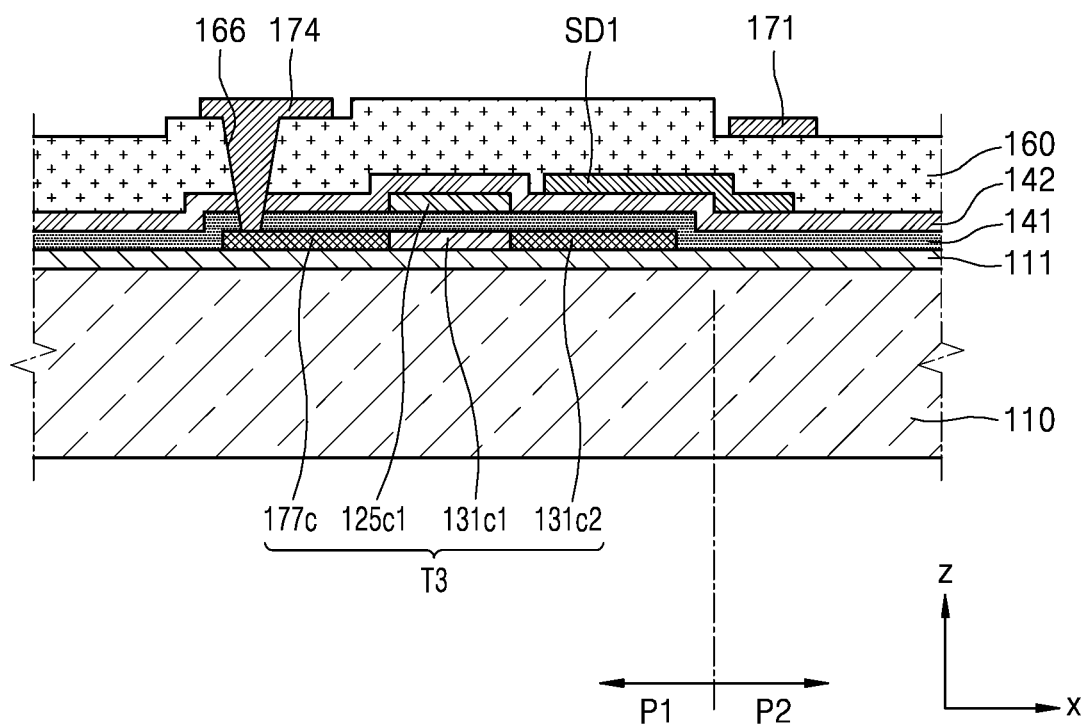
FIG. 8 is a cross-sectional view of an organic light-emitting display apparatus according to some embodiments of the present invention.

Alternatively, the first shield layer SD1 may extend below the data line 171 of the (sub) pixel P2 as shown in FIG. 8 that is a cross-sectional view of an organic light-emitting display apparatus according to some embodiments of the present invention. Accordingly, the part 131*c*2 of the compensating TFT T3 may be further shielded. Here, the part 131*c*2 of the compensating TFT T3 may also be further shielded by extending the first shield layer SD1 above at least a part of the part 131*c*2 between the first and second gate electrodes 125*c*1 and 125*c*2 of the compensating TFT T3.

Figure 9:
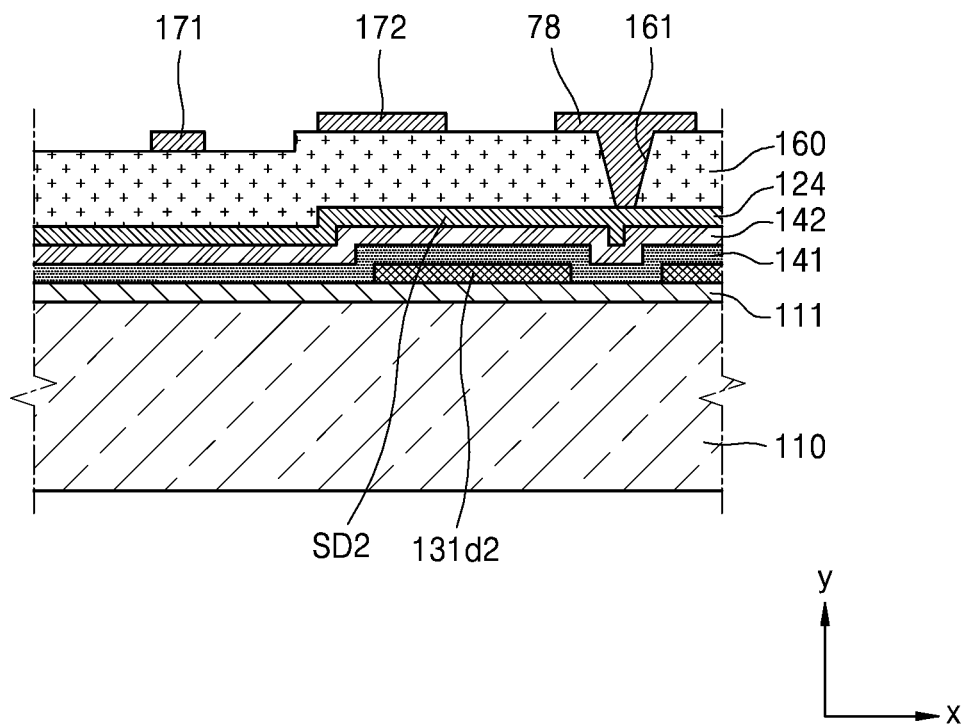
FIG. 9 is a cross-sectional view taken along the line IX-IX of FIG. 2.

FIG. 9 is a cross-sectional view taken along the line IX-IX of FIG. 2. As shown in FIGS. 2, 5, and 9, the initialization voltage line 124 may include a second shield layer SD2.

As shown in FIGS. 2 and 5, the second shield layer SD2 may be a part of the initialization voltage line 124, which extends along an x-axis. The second shield layer SD2 may be understood to be a part of the initialization voltage line 124, which extends between the data line 171 and at least a part between first gate electrode 125*d*1 and a second gate electrode 125*d*2 of the initialization gate electrode 125*d*1 and 125*d*2 of the initialization TFT T4.

In FIGS. 2 and 5, the initialization voltage line 124 extends above the part between the first and second gate electrodes 125*d*1 and 125*d*2 of the initialization TFT T4, but an embodiment is not limited thereto. If the initialization voltage line 124 has another location or another shape, for example, is moved in a +y direction, a −y direction, or another direction, or is curved, the initialization voltage line 124 may have a protrusion and the protrusion may extend between the data line 171 and at least a part between the first and second gate electrodes 125*d*1 and 125*d*2 of the initialization TFT T4 to operate as the second shield layer SD2. In other words, in FIGS. 2 and 5, the initialization voltage line 124 may extend along an x-axis direction while passing between the data line 171 and at least the part between the first and second gate electrodes 125*d*1 and 125*d*2 of the initialization TFT T4, such that a location of the initialization voltage line 124 is specified without having to include the protrusion.

If the second shield layer SD2 does not exist, the components between the first and second gate electrodes 125*d*1 and 125*d*2 of the initialization TFT T4, for example, a part 131*d*2 of the initialization semiconductor layer 131*d*1, 131*d*2, and 131*d*3 may be affected by the data line 171.

The data line 171 transmits a data signal to the (sub) pixel of FIG. 2, and also transmits a data signal to a plurality of (sub) pixels disposed near the (sub) pixel of FIG. 2 in +y and −y directions. Here, a data signal being transmitted may vary according to luminance to be realized by the plurality of (sub) pixels disposed near the (sub) pixel of FIG. 2 in the +y and −y directions, and accordingly, the data line 171 near the part 131*d*2 of the initialization semiconductor layer 131*d*1, 131*d*2, and 131*d*3 of the (sub) pixel of FIG. 2 transmits different electric signals according to time while the (sub) pixel of FIG. 2 emits light.

If the second shield layer SD2 does not exist, parasitic capacitance may occur between the data line 171 and the part 131d2 of the initialization semiconductor layer 131d1, 131d2, and 131d3 of the initialization TFT T4, and thus electric potential of the part 131d2 of the initialization semiconductor layer 131d1, 131d2, and 131d3 of the initialization TFT T4 may be affected by the different electric signals transmitted by the data line 171, according to time while the (sub) pixel of FIG. 2 emits light. Because the initialization TFT T4 is electrically coupled to the driving TFT T1, if the electric potential of the part 131d2 of the initialization semiconductor layer 131d1, 131d2, and 131d3 of the initialization TFT 4 is affected by the different electric signals transmitted by the data line 171, the luminance of the organic light-emitting device OLED determined by the driving TFT T1 may become different from an initial intention, and thus quality of an image displayed by the organic light-emitting display apparatus may deteriorate.

However, according to the organic light-emitting display apparatus of some embodiments, because the second shield layer SD2 is arranged between the data line 171 and the part 131d2 of the initialization semiconductor layer 131d1, 131d2, and 131d3 of the initialization TFT T4, the part 131d2 of the initialization semiconductor layer 131d1, 131d2, and 131d3 of the initialization TFT T4 may not be affected or may be less affected by the data line 171, and thus the organic light-emitting display apparatus may be able to display an image having a more accurate luminance and a relatively higher quality. For example, if the second shield layer SD2 is a part of the initialization voltage line 124, the second shield layer SD2 may always have a uniform electric potential by the initialization voltage line 124 that always has uniform electric potential. Accordingly, an effect of an adjacent electric signal on the part 131d2 of the initialization semiconductor layer 131d1, 131d2, and 131d3 of the initialization TFT T4 may be reduced.

Here, if a layout of various wires or a semiconductor layer differs from that shown in FIG. 2, the second shield layer SD2 may be a part extending at least above the part 131d2 of the initialization semiconductor layer 131d1, 131d2, and 131d3 between the first and second gate electrodes 125d1 and 125d2 of the initialization TFT T4, or a part extending below the data line 171.

Figure 10:
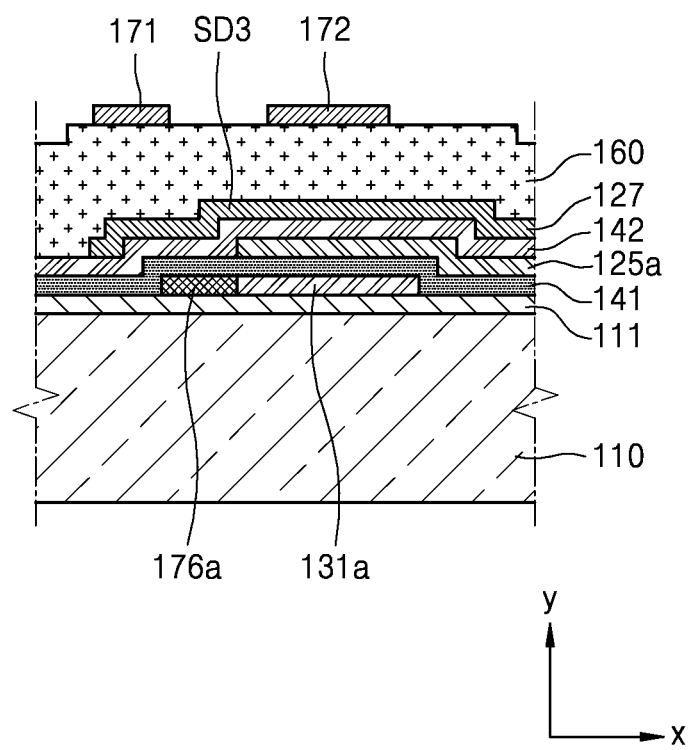
FIG. 10 is a cross-sectional view taken along the line X-X of FIG. 2.

FIG. 10 is a cross-sectional view taken along the line X-X of FIG. 2. As shown in FIGS. 2, 5, and 10, the second storage capacitor plate 127 may include a third shield layer SD3.

As shown in FIGS. 2 and 5, the third shield layer SD3 may be a part of the second storage capacitor plate 127. The third shield layer SD3 may be understood to be a part of the second storage capacitor plate 127, which extends between the data line 171 and the driving gate electrode 125a of the driving TFT T1. For example, the second storage capacitor plate 127 may have a (virtual) end in the −x direction, which approximately match an end of the first storage capacitor plate 125a in the −x direction below the second storage capacitor plate 127, and the third shield layer SD3 may exist between the data line 171 and the driving gate electrode 125a of the driving TFT T1 in the −x direction from the (virtual) end, wherein the third shield layer SD3 may be understood to be integrally formed with the second storage capacitor plate 127.

Alternatively, unlike shown in FIGS. 2 and 5, the second storage capacitor plate 127 may not extend in the −x direction where the data line 171 is located due to nonexistence of the third shield layer SD3, and the end of the second storage capacitor plate 127 in the −x direction may approximately match the end of the first storage capacitor plate 125a in the −x direction. In this case, the driving gate electrode 125a of the driving TFT T1 is affected by the data line 171.

The data line 171 transmits a data signal to the (sub) pixel of FIG. 2, and also transmits a data signal to the plurality of (sub) pixels disposed in the +y and −y directions of the (sub) pixel. Here, the data signal being transmitted may vary according to the luminance to be realized by the plurality of (sub) pixels disposed in the +y and −y directions of the (sub) pixel of FIG. 2, and accordingly, the data line 171 near the part 131d2 of the initialization semiconductor layer 131d1, 131d2, and 131d3 of the (sub) pixel of FIG. 2 may transmit different electric signals according to time while the (sub) pixel of FIG. 2 emits light.

If the third shield layer SD3 does not exist and thus the second storage capacitor plate 127 does not extend in the −x direction where the data line 171 is disposed and the end of the second storage capacitor plate 127 in the −x direction approximately matches the end of the first storage capacitor plate 125a in the −x direction, parasitic capacitance exists between the data line 171 and the driving gate electrode 125a of the driving TFT T1, and accordingly, electric potential of the driving gate electrode 125a of the driving TFT T1 is affected by the different electric signals transmitted by the data line 171 according to time while the (sub) pixel of FIG. 2 emits light. As a result, the luminance of the organic light-emitting device OLED determined by the driving TFT T1 may become different from an initial intention, and thus quality of an image displayed by the organic light-emitting display apparatus may deteriorate.

However, according to the organic light-emitting display apparatus of the current embodiment, because the third shield layer SD3 exists between the data line 171 and the driving gate electrode 125a of the driving TFT T1, the driving gate electrode 125a of the driving TFT T1 may not be affected or may be less affected by the data line 171, and thus the organic light-emitting display apparatus may be able to display an image having a more accurate luminance and a relatively higher quality. For example, if the third shield layer SD3 is a part of the second storage capacitor plate 127, the second storage capacitor plate 127 is coupled to the driving voltage line 172 always having uniform electric potential, through the contact hole 168, and thus the third shield layer SD3 may also always have a uniform electric potential. Accordingly, an effect of an adjacent electric signal on the driving gate electrode 125a of the driving TFT T1 may be reduced.

Of course, the third shield layer SD3 may not only be disposed between the data line 171 and the driving gate electrode 125a, and may also extend below the data line 171 as shown in FIG. 10. Accordingly, the driving gate electrode 125a of the driving TFT T1 may be further shielded.

Hereinabove, the organic light-emitting display apparatus may include the first shield layer SD1, the second shield layer SD2, and the third shield layer SD3, but alternatively, the organic light-emitting display apparatus may include only some of the first through third shield layers SD1 through SD3. In other words, the organic light-emitting display apparatus may include at least any one of the first through third shield layers SD1 through SD3.

In the above embodiments, the compensating TFT T3 and the initialization TFT T4 include a dual gate electrode. However, an embodiment is not limited thereto and the organic light-emitting display apparatus may include the first or second shield layer SD1 or SD2 disposed between the data line 171 and a part of the compensating TFT T3 and/or the initialization TFT T4, even if the compensating TFT T3 and the initialization TFT T4 include a single gate electrode.

Meanwhile, all of the first through third shield layers SD1 through SD3 are included in the second gate wire as shown in FIGS. 2 and 5, but an embodiment is not limited thereto. In other words, the first through third shield layers SD1 through SD3 may be a part of the second storage capacitor plate 127 or a part of the initialization voltage line 124.

Figure 11:
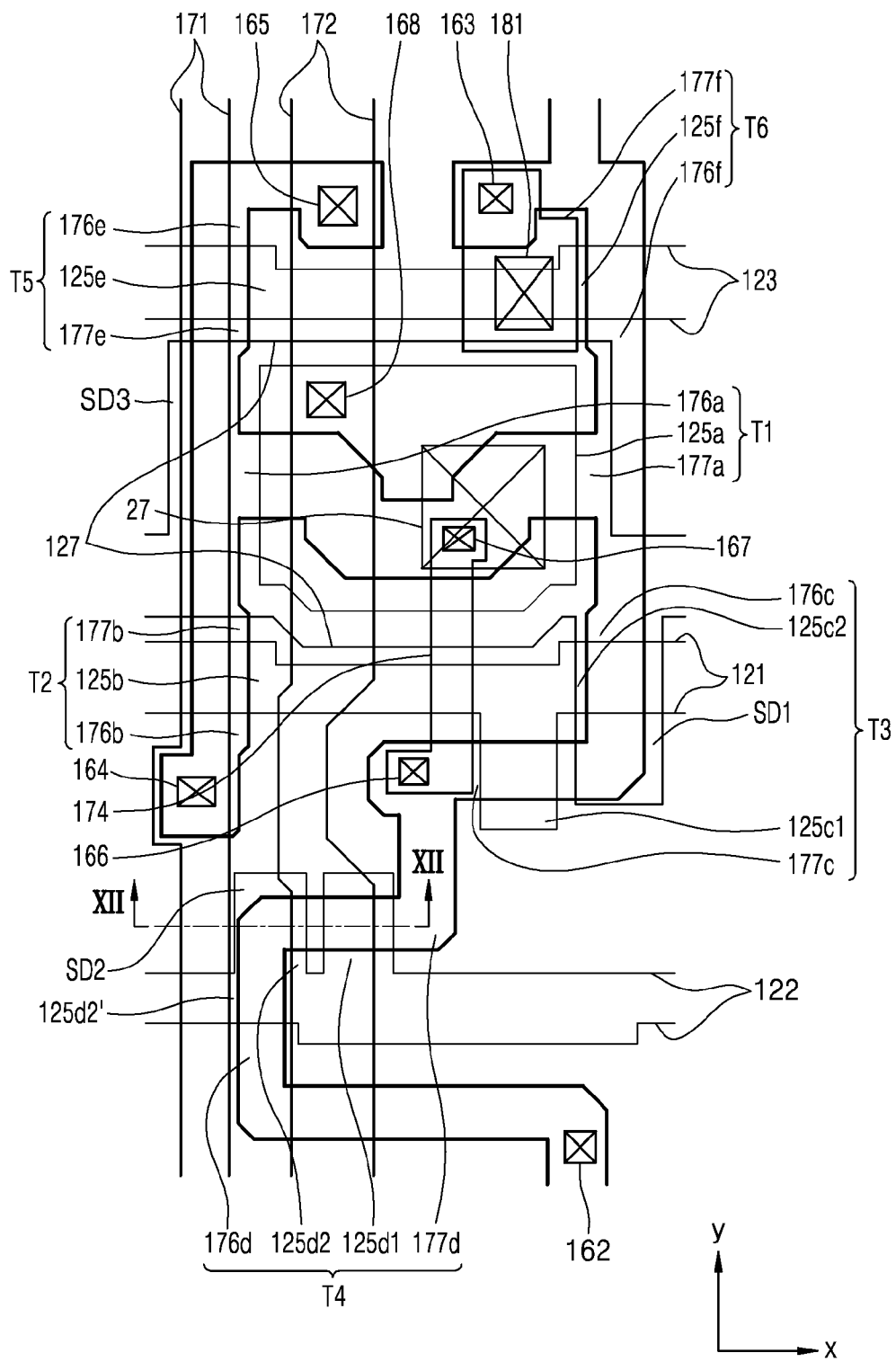
FIG. 11 is a schematic diagram showing locations of a plurality of TFTs and a capacitor in a (sub) pixel of an organic light-emitting display apparatus, according to another embodiment of the present invention.
Figure 12:
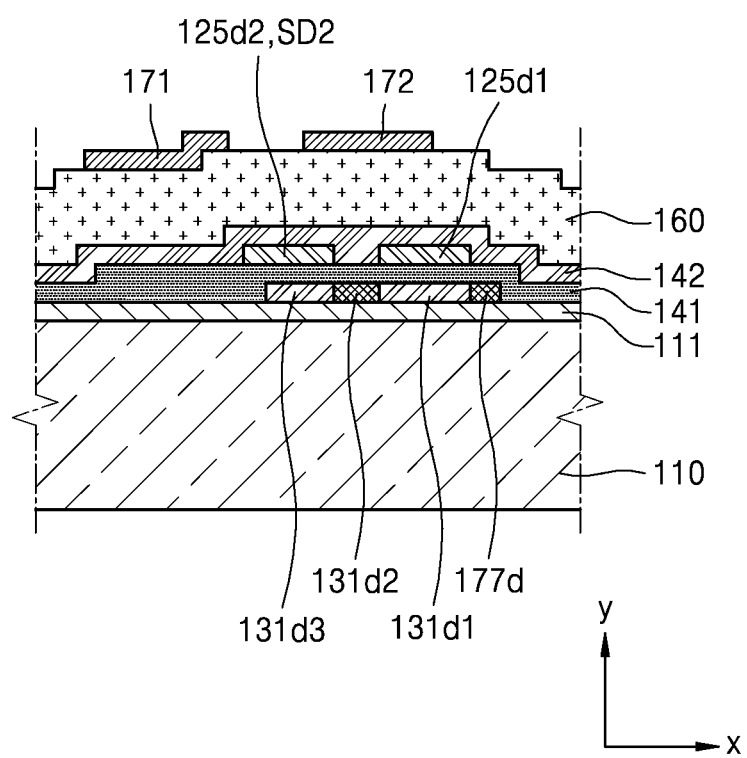
FIG. 12 is a cross-sectional view taken along the line XII-XII of FIG. 11.

FIG. 11 is a schematic diagram showing locations of a plurality of TFTs and a capacitor in a (sub) pixel of an organic light-emitting display apparatus, according to another embodiment of the present invention, and FIG. 12 is a cross-sectional view taken along the line XII-XII of FIG. 11. Differences between the organic light-emitting display apparatuses of FIGS. 2 and 11 are shapes of the previous scan lines 122, the initialization voltage lines 124, and the initialization TFTs T4.

Referring to FIGS. 11 and 12, the initialization voltage line may be arranged in the same layer as the second storage capacitor plate 127, or in the same layer as a pixel electrode. The initialization voltage line may be coupled to the initialization source electrode 176d of the initialization TFT T4 through the contact hole 162. As described above with reference to FIG. 2, the initialization drain electrode 177d of the initialization TFT T4 is electrically coupled to the compensating drain electrode 177c of the compensating TFT T3 and the driving gate electrode 125a of the driving TFT T1.

The previous scan line 122 that may be arranged in the same layer as the driving gate electrode 125a, the scan line 121, and the emission control line 123 may include two protrusions corresponding to a location of the initialization TFT T4. Here, the two protrusions may be the first and second gate electrodes 125d1 and 125d2 of the initialization TFT T4. At least a part of the second gate electrode 125d2 may be the second shield layer SD2.

A dual gate electrode may have two parts overlapping a semiconductor layer. For example, referring to FIG. 11, the second gate electrode 125d2 of the initialization TFT T4 may be a part of the previous scan line 122 extending along an x-axis without having to protrude from the previous scan line 122, and a part 125d2' of the first gate electrode 125d1 in the −x direction, which crosses a semiconductor layer near the initialization source electrode 176d, may operate as a second gate electrode. However, in this case, a part between a part of the semiconductor layer corresponding to the part 125d2' and a part of the semiconductor layer corresponding to the first gate electrode 125d1 is arranged adjacent to the data line 171 and is not shielded, and thus may be affected by the data line 171.

However, according to the organic light-emitting display apparatus of the some embodiments, the previous scan line 122 includes the two protrusions, wherein one of the protrusions operates as the first gate electrode 125d1 and the other one of the protrusions protrudes form the part 125d2' of the previous can line 122 and operates as the second gate electrode 125d2. Here, the second gate electrode 125d2 shields the part between the part of the semiconductor layer corresponding to the part 125d2' and the part of the semiconductor layer corresponding to the first gate electrode 125d1 from the data line 171, and thus an unintended effect on the initialization TFT T4 from the data line 171 may be effectively blocked or reduced.

According to the initialization TFT T4 having such a structure, the initialization TFT T4 includes the first and second gate electrodes 125d1 and 125d2, and one of the first and second gate electrodes 125d1 and 125d2 is at least partially disposed between the data line 171 and the semiconductor layer 131d2 that is a part between the source electrode 176d and the other of the first and second gate electrodes 125d1 and 125d2 of the initialization TFT T4. In FIGS. 11 and 12, the second gate electrode 125d2 is at least partially disposed between the data line 171 and the semiconductor layer 131d2 that is the part between the source electrode 176d and the first gate electrode 125d1 of the initialization TFT T4, and thus the semiconductor layer 131d2 is shielded from the data line 171. In other words, the second gate electrode 125d2 is shown to be the second shield layer SD2. Here, the second gate electrode 125d2 may not only be arranged between the data line 171 and the semiconductor layer 131d2 as shown in FIGS. 11 and 12, but may also extend below the data line 171 in the −x direction. In FIG. 12, the data line 171 is arranged above the second gate electrode 125d2, but if the data line 171 is arranged below the semiconductor layer 131d2 and the second gate electrode 125d2 is arranged between the data line 171 and the semiconductor layer 131d2, the second gate electrode 125d2 may extend above the data line 171.

As such, the second shield layer SD2 may be formed as the second gate wire as described above with reference to FIGS. 2, 5, and 9, but may alternatively be formed as the first gate wire as described with reference to FIGS. 11 and 12. If the first or third shield layer SD1 or SD3 is included as well as the second shield layer SD2, the first or third shield layer SD1 or SD3 may be formed as the first gate wire. In this case, the first or third shield layer SD1 or SD3 may not be electrically coupled to the second storage capacitor plate 127, but may have an island shape and electrically float.

Hereinabove, it is described that the parts of the driving TFT T1, the compensating TFT T3, and the initialization TFT T4 are shielded from the data line 171, but an embodiment is not limited thereto. In other words, if a TFT of a (sub) pixel of an organic light-emitting display apparatus is near the data line 171, a shield layer may be disposed between the data line 171 and at least a part of the TFT such that the organic light-emitting display apparatus displays an image having high quality. The shield layer may be arranged at least one of between the data line 171 and a source electrode of the TFT, between the data line 171 and a drain electrode of the TFT, and between the data line 171 and a gate electrode of the TFT.

Meanwhile, hereinabove, it is described that a shield layer is arranged between a data line and a part of a TFT, but an embodiment is not limited thereto. For example, an organic light-emitting display apparatus may include a TFT that includes a source electrode, a drain electrode, and a gate electrode, a control signal line that is arranged in a layer different from the source electrode, the drain electrode, and the gate electrode and transmits a control signal, and a shield layer that is arranged between the control signal line and at least a part of the TFT. Here, the control signal line may be at least any one of the plurality of signal lines described above. In other words, the control signal line may be the scan line 121, the previous scan line 122, the emission control line 123, the data line 171, the driving voltage line 172, or the initialization voltage line 124. The shield layer may shield the at least the part of the TFT from the control signal line so as to block or reduce an effect of a control signal transmitted from the control signal line on the TFT.

An embodiment of the present is not limited to an organic light-emitting display apparatus. An image having high quality may be displayed as long as a display apparatus including a TFT and a data line in a (sub) pixel has a shield layer in the same or similar manner described above.

As described above, according to one or more embodiments of the present invention, a display apparatus capable of preventing quality deterioration of a displayed image may be realized.

While one or more embodiments of the present invention have been described with reference to the figures, it will be understood by those of ordinary skill in the art that various changes in form and details may be made therein without departing from the spirit and scope of the present invention as defined by the following claims, and their equivalents.

What is claimed is:

1. A display apparatus comprising:
a first thin-film transistor comprising a first semiconductor comprising a source area, a drain area, and a channel area between the source area and the drain area;
a first electrode layer over the first semiconductor and overlapping the channel area of the first semiconductor;
a second electrode layer over the first electrode layer, a part of the second electrode layer overlapping the first electrode layer;
a first signal line over the second electrode layer; and
a first shield layer in a layer between the first signal line and the first semiconductor and overlapping a part of one of the source area and the drain area of the first semiconductor.

2. The display apparatus of claim 1, wherein the first shield layer is a part of the second electrode layer and overlaps a part of the first signal line.

3. The display apparatus of claim 1, further comprising a second thin-film transistor comprising a second semiconductor, one end of the second semiconductor being connected to one end of the first semiconductor, and the other end of the second semiconductor being connected to the first signal line.

4. The display apparatus of claim 1, further comprising a first voltage line in the same layer as the first signal line and connected to the second electrode layer.

5. The display apparatus of claim 1, further comprising:
a third thin-film transistor comprising a third semiconductor, one end of the third semiconductor being connected to one end of the first semiconductor, and the other end of the third semiconductor being connected to the first electrode layer; and
a second shield layer in a layer between the first signal line and the third semiconductor and overlapping a part between a first channel area and a second channel area of the third semiconductor.

6. The display apparatus of claim 1, further comprising:
a fourth thin-film transistor comprising a fourth semiconductor, one end of the fourth semiconductor being connected to the first electrode layer, and the other end of the fourth semiconductor being connected to a second voltage line; and
a third shield layer in a layer between the first signal line and the fourth semiconductor and overlapping a part of the fourth semiconductor.

7. The display apparatus of claim 1, further comprising:
a fourth thin-film transistor comprising a fourth semiconductor, one end of the fourth semiconductor being connected to the first electrode layer, and the other end of the fourth semiconductor being connected to a second voltage line; and
a third shield layer in a layer between the first signal line and the fourth semiconductor and overlapping a part between a first channel area and a second channel area of the fourth semiconductor.

8. The display apparatus of claim 1, wherein the first signal line extends in a first direction, and
wherein a length along the first direction of the overlapping part of the first shield layer with the part of one of the source area and the drain area of the first semiconductor is larger than a length of the first electrode layer along the first direction.

9. The display apparatus of claim 1, wherein the first shield layer fully overlaps the part of one of the source area and the drain area of the first semiconductor.

10. The display apparatus of claim 1, wherein the first signal line extends in a first direction, and
wherein a length along the first direction of the overlapping part of the first shield layer with the first signal line is larger than a length of the first electrode layer along the first direction.

11. The display apparatus of claim 5, wherein a gate electrode of the third thin-film transistor comprises a first gate electrode and a second gate electrode in a same layer, the first gate electrode overlapping the first channel area of the third semiconductor, and the second gate electrode overlapping the second channel area of the third semiconductor, and
wherein the gate electrode of the third thin-film transistor is a part of a second signal line crossing the first signal line and is in the same layer as the first electrode layer.

12. The display apparatus of claim 5, further comprising a first voltage line in the same layer as the first signal line,
wherein the second shield layer is connected to the first voltage line.

13. The display apparatus of claim 5, wherein the second shield layer is a part of the second electrode layer.

14. The display apparatus of claim 5, further comprising a connecting line connecting the other end of the third semiconductor and the first electrode layer and being in the same layer as the first signal line.

15. The display apparatus of claim 6, wherein a gate electrode of the fourth thin-film transistor comprises a first gate electrode and a second gate electrode in a same layer and overlapping the fourth semiconductor, and
wherein the third shield layer is a part of the second voltage line and overlaps a part of the fourth semiconductor between the first gate electrode and the second gate electrode.

16. The display apparatus of claim 15, wherein the gate electrode of the fourth thin-film transistor is a part of a third signal line crossing the first signal line and is in the same layer as the first electrode layer.

17. The display apparatus of claim 7, wherein the third shield layer is a part of the second voltage line.

18. The display apparatus of claim 7, wherein a gate electrode of the fourth thin-film transistor comprises a first gate electrode and a second gate electrode in a same layer, the first gate electrode overlapping the first channel area of the fourth semiconductor, and the second gate electrode overlapping the second channel area of the fourth semiconductor, and
wherein the gate electrode of the fourth thin-film transistor is a part of a third signal line crossing the first signal line and is in the same layer as the first electrode layer.

19. The display apparatus of claim 7, further comprising a connecting line connecting the one end of the fourth semiconductor and the first electrode layer and being in the same layer as the first signal line.

20. The display apparatus of claim 3, further comprising a fifth thin-film transistor comprising a fifth semiconductor, one end of the fifth semiconductor being connected to the one end of the first semiconductor and the one end of the second semiconductor, and the other end of the fifth semiconductor being connected to a first voltage line, wherein the first voltage line in the same layer as the first signal line and connected to the second electrode layer.

21. The display apparatus of claim 20, further comprising a fourth shield layer in a layer between the first signal line and the fifth semiconductor, wherein the fourth shield layer overlaps a part of semiconductor between the channel area of the first semiconductor, the channel area of the second semiconductor, and the channel area of the fifth semiconductor.

22. The display apparatus of claim 21, wherein the fourth shield layer is a part of the second electrode layer.

23. The display apparatus of claim 22, further comprising a capacitor comprising a first capacitor plate and a second capacitor plate, wherein the first capacitor plate is a part of the first electrode layer, and the second capacitor plate is a part of the second electrode layer.

24. A display apparatus comprising:
a first thin-film transistor comprising a first semiconductor;
a first electrode layer over the first semiconductor and overlapping a channel area of the first semiconductor;
a first signal line over the first electrode layer;
a second thin-film transistor comprising a second semiconductor, one end of the second semiconductor being connected to the first electrode layer, and the other end of the second semiconductor being connected to a voltage line; and
a shield layer in a layer between the first signal line and the second semiconductor and overlapping a part between a first channel area and a second channel area of the second semiconductor.

25. The display apparatus of claim 24, wherein a gate electrode of the second thin-film transistor comprises a first gate electrode and a second gate electrode in a same layer, the first gate electrode overlapping the first channel area of the second semiconductor, and the second gate electrode overlapping the second channel area of the second semiconductor, and wherein the gate electrode of the second thin-film transistor is a part of a second signal line crossing the first signal line and is in the same layer as the first electrode layer.

26. The display apparatus of claim 24, wherein the shield layer is a part of the voltage line.

27. The display apparatus of claim 24, further comprising a connecting line connecting the one end of the second semiconductor and the first electrode layer and being in the same layer as the first signal line.

28. A display apparatus comprising:
a first thin-film transistor comprising a first semiconductor;
a first electrode layer over the first semiconductor and overlapping a channel area of the first semiconductor;
a first signal line over the first electrode layer;
a second thin-film transistor comprising a second semiconductor, one end of the second semiconductor being connected to one end of the first semiconductor, and the other end of the second semiconductor being connected to the first electrode layer; and
a shield layer in a layer between the first signal line and the second semiconductor and overlapping a part between a first channel area and a second channel area of the second semiconductor.

29. The display apparatus of claim 28, wherein a gate electrode of the second thin-film transistor comprises a first gate electrode and a second gate electrode in a same layer, the first gate electrode overlapping the first channel area of the second semiconductor, and the second gate electrode overlapping the second channel area of the second semiconductor, and wherein the gate electrode of the second thin-film transistor is a part of a second signal line crossing the first signal line and is in the same layer as the first electrode layer.

30. The display apparatus of claim 28, further comprising a voltage line in the same layer as the first signal line, wherein the shield layer is connected to the voltage line.

31. The display apparatus of claim 28, further comprising a second electrode layer over the first electrode layer and overlapping the first electrode layer, wherein the shield layer is a part of the second electrode layer.

32. The display apparatus of claim 31, further comprising a voltage line in the same layer as the first signal line, wherein the voltage line is connected to the second electrode layer.

33. A display apparatus comprising:
a first thin-film transistor comprising a first semiconductor comprising a source area, a drain area, and a channel area between the source area and the drain area;
a first electrode layer over the first semiconductor and overlapping the channel area of the first semiconductor;
a second electrode layer over the first electrode layer, a part of the second electrode layer overlapping the first electrode layer;
a first signal line over the second electrode layer; and
a first shield layer in a layer between the first signal line and the first semiconductor and overlapping a part of one of the source area and the drain area of the first semiconductor, wherein the first shield layer is a part of the second electrode layer and overlaps a part of the first signal line, wherein the first signal line extends in a first direction, and wherein a length along the first direction of the overlapping part of the first shield layer with the first signal line is larger than a length of the first electrode layer along the first direction.

* * * * *